(12) United States Patent
Mizusaki et al.

(10) Patent No.: US 10,686,095 B2
(45) Date of Patent: Jun. 16, 2020

(54) PHOTOELECTRIC SENSOR

(71) Applicant: OMRON Corporation, Kyoto (JP)

(72) Inventors: Hiroyuki Mizusaki, Kyoto (JP); Makoto Sugimoto, Kyoto (JP); Jumpei Nakamura, Kyoto (JP); Tomohiro Tsuji, Kyoto (JP)

(73) Assignee: OMRON Corporation, Kyoto (JP)

(*) Notice: Subject to any disclaimer, the term of this patent is extended or adjusted under 35 U.S.C. 154(b) by 0 days.

(21) Appl. No.: 16/276,623

(22) Filed: Feb. 15, 2019

(65) Prior Publication Data

US 2019/0288152 A1   Sep. 19, 2019

(30) Foreign Application Priority Data

Mar. 15, 2018   (JP) ................ 2018-047802

(51) Int. Cl.
*H01L 31/0203* (2014.01)
*H01L 31/12* (2006.01)
(Continued)

(52) U.S. Cl.
CPC .......... *H01L 31/125* (2013.01); *G01J 1/0271* (2013.01); *G01J 1/04* (2013.01); *G01J 1/0403* (2013.01); *H01L 31/0203* (2013.01); *H01L 31/02325* (2013.01); *B29C 45/14311* (2013.01); *B29C 2045/14459* (2013.01); *B29K 2995/0094* (2013.01); *B29L 2031/34* (2013.01); *G01J 2001/0276* (2013.01)

(58) Field of Classification Search
CPC .......... H01L 25/046; H01L 31/0248
See application file for complete search history.

(56) References Cited

U.S. PATENT DOCUMENTS

2004/0166763 A1* 8/2004 Hanada ............ H01L 31/02325
445/51
2010/0080865 A1   4/2010 Kotani et al.
(Continued)

FOREIGN PATENT DOCUMENTS

EP   1614518   1/2006
EP   2894677   7/2015
(Continued)

OTHER PUBLICATIONS

"Search Report of Europe Counterpart Application", dated Jul. 31, 2019, pp. 1-7.

*Primary Examiner* — Cheung Lee
(74) *Attorney, Agent, or Firm* — JCIPRNET

(57) ABSTRACT

A photoelectric sensor including at least any one of a light projecting unit for emitting light and a light receiving unit for detecting light includes a substrate on which at least any one of the light projecting unit and the light receiving unit is mounted, a cover which has a protecting portion facing the substrate and for protecting the substrate and a side wall extending from a periphery of the protecting portion, and a sealing member which seals at least any one of the light projecting unit and the light receiving unit that is mounted on the substrate, in which the cover has a protruding portion on a surface which is positioned outside a side surface of the substrate and intersects an extending direction of the side wall, and the protruding portion is in contact with the sealing member.

16 Claims, 5 Drawing Sheets

(51) Int. Cl.
   _H01L 31/0232_   (2014.01)
   _G01J 1/04_      (2006.01)
   _G01J 1/02_      (2006.01)
   _B29C 45/14_         (2006.01)
   _B29L 31/34_         (2006.01)

(56) References Cited

U.S. PATENT DOCUMENTS

2015/0102212 A1    4/2015  Ruh
2015/0331106 A1*  11/2015  Okada .................. G01S 17/026
                                                          250/216

FOREIGN PATENT DOCUMENTS

JP          H04342916       11/1992
JP          2014107698       6/2014

* cited by examiner

PHOTOELECTRIC SENSOR

CROSS-REFERENCE TO RELATED APPLICATION

This application claims the priority of Japan patent application serial no. 2018-047802, filed on Mar. 15, 2018. The entirety of the above-mentioned patent application is hereby incorporated by reference herein and made a part of this specification.

BACKGROUND

Technical Field

The disclosure relates to a photoelectric sensor.

Description of Related Art

Conventionally, a photoelectric sensor is used to detect the presence or absence of an object in a detection region (for example, Patent Document 1 and the like). In photoelectric sensors, there is a transmissive sensor configured such that a light projecting unit for emitting light and a light receiving unit for detecting light are accommodated in separate housings, and the light emitted from one photoelectric sensor is received by another photoelectric sensor. When there is an object between the light projecting unit and the light receiving unit, the light is blocked and the amount of light received by the light receiving unit decreases. The transmissive sensor detects the presence or absence of an object by measuring the amount of decrease. Also, in photoelectric sensors, there is a reflective sensor in which a light projecting unit and a light receiving unit are accommodated in a unitary housing, and the presence or absence of an object is detected by reflecting light on the object and measuring the reflected light.

The light projecting unit and the light receiving unit are constituted by optical elements such as light emitting diodes and photodiodes, and are mounted on a substrate inside the housing. In order to seal components such as optical elements mounted on the substrate, a cover having a protecting portion facing the substrate and a side wall extending from a peripheral edge of the protecting portion toward the substrate side may be put on the substrate, and its periphery may be covered with a sealing member such as a resin.

In order to increase adhesion between the cover and the sealing member to improve sealing properties, there is a method of providing a protruding portion on an outer wall of the cover. In a sealing process, when a high-temperature sealing member comes into contact with the cover, the protruding portion is more likely to transmit heat as compared with other portions and is easily softened. Since the softened protruding portion fits well with the sealing member, the adhesion between the cover and the sealing member can be increased. Thus, the above method is used.

However, since the protruding portion provided on the outer wall protrudes in a direction perpendicular to the outer wall, it is necessary to use a split mold rather than a punching mold in manufacturing the cover having the protruding portion. For that reason, a plurality of molds must be prepared, which may lead to an increase in manufacturing costs of the photoelectric sensor.

Patent Documents

[Patent Document 1] Japanese Laid-open No. 2014-107698

SUMMARY

A photoelectric sensor according to one aspect of the disclosure is a photoelectric sensor which includes at least either one of a light projecting unit for emitting light and a light receiving unit for detecting light. The photoelectric sensor includes a substrate on which at least any one of the light projecting unit and the light receiving unit is mounted, a cover which has a protecting portion facing the substrate and for protecting the substrate and a side wall extending from a periphery of the protecting portion, and a sealing member which seals at least any one of the light projecting unit and the light receiving unit that is mounted on the substrate. The cover has a protruding portion on a surface which is positioned outside a side surface of the substrate and intersects an extending direction of the side wall, and the protruding portion is in contact with the sealing member.

DESCRIPTION OF THE EMBODIMENTS

Figure 1:
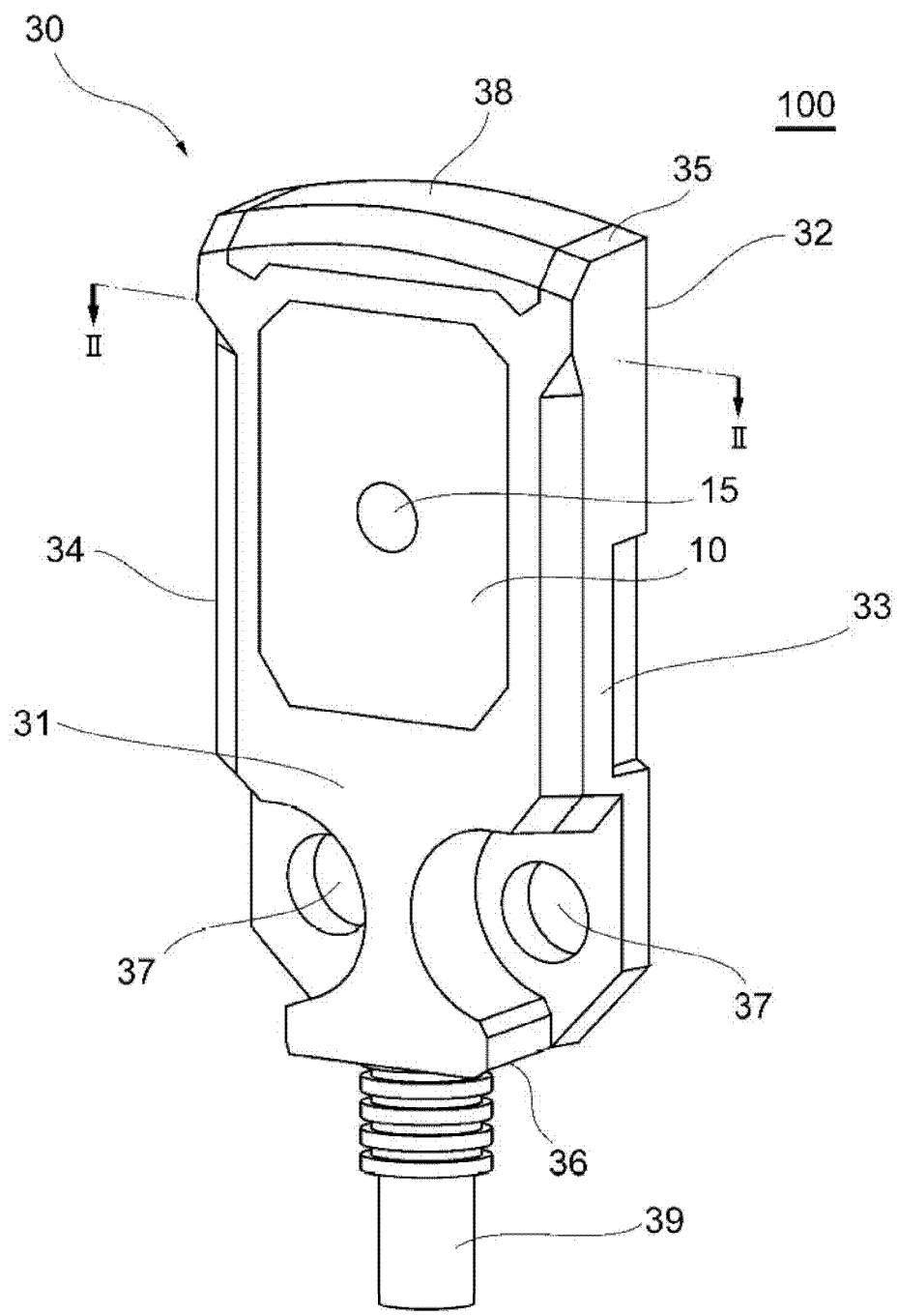
FIG. 1 is a perspective view of a photoelectric sensor according to an embodiment of the disclosure.

It is an objective of the disclosure to provide a photoelectric sensor which can be manufactured at lower cost and has excellent sealing properties.

A photoelectric sensor according to one aspect of the disclosure is a photoelectric sensor which includes at least either one of a light projecting unit for emitting light and a light receiving unit for detecting light. The photoelectric sensor includes a substrate on which at least any one of the light projecting unit and the light receiving unit is mounted, a cover which has a protecting portion facing the substrate and for protecting the substrate and a side wall extending from a periphery of the protecting portion, and a sealing member which seals at least any one of the light projecting unit and the light receiving unit that is mounted on the substrate. The cover has a protruding portion on a surface which is positioned outside a side surface of the substrate and intersects an extending direction of the side wall, and the protruding portion is in contact with the sealing member.

According to this aspect, since the protruding portion is softened by the heat of the sealing member in a sealing process with the sealing member, the adhesion between the sealing member and the cover is increased, and the sealing properties are improved. In addition, since the cover provided with the protruding portion can be manufactured by die casting rather than split molding, it is unnecessary to prepare a plurality of molds, and the photoelectric sensor can be manufactured at lower cost.

In the above aspect, the protruding portion may extend in a longitudinal direction of the side wall.

According to this aspect, the protruding portion is formed in a wide range along the longitudinal direction of the side wall. Therefore, the adhesion between the cover and the sealing member is further enhanced, and the sealing performance can be further improved.

In the above aspect, the protruding portion may extend on a peripheral edge of the cover to surround the substrate.

According to this aspect, the protruding portion is formed over a wide range around the entire periphery of the cover. Therefore, the adhesion between the cover and the sealing member is further enhanced, and the sealing performance can be further improved.

In the above aspect, a lens may be formed in the protecting portion.

According to this aspect, since the lens is formed in the protecting portion, there is no need to secure a region for mounting the lens on the substrate. For that reason, it is possible to secure a large mounting space for a component other than the lens, so that a larger component can be mounted on the substrate.

In the above aspect, the surface on which the protruding portion is provided may be orthogonal to the extending direction of the side wall.

According to the disclosure, it is possible to provide a photoelectric sensor which can be manufactured at lower cost and has excellent sealing properties.

Embodiments of the disclosure will be described with reference to the accompanying drawings. Also, in the drawings, elements denoted by the same reference numeral have the same or similar configuration.

FIG. 1 is a perspective view of a photoelectric sensor 100 according to an embodiment of the disclosure. The photoelectric sensor detects the presence or absence of an object in a detection region, surface conditions of the object, and the like by using light. There are a plurality of detection methods using the photoelectric sensor. For example, two photoelectric sensors may be provided, one photoelectric sensor may be used as a light projector for emitting light, and the other photoelectric sensor may be used as a light receiver for detecting light. If there is an object between the light projector and the light receiver, an amount of light received by the light receiver decreases. The photoelectric sensor measures the amount of decrease and detects the presence or absence of an object. The photoelectric sensor used in this detection method is called a transmissive type.

As another detection method, there is a method of detection by using a photoelectric sensor in which a light projector and a light receiver are integrally formed. Light is emitted from the photoelectric sensor towards a reflector, a detection object, etc., and the same photoelectric sensor receives and measures the reflected light, thereby detecting the presence or absence of an object. Such a photoelectric sensor which functions as both a light projector and a light receiver is called a reflective type.

With reference to FIG. 1, the configuration of the photoelectric sensor 100 will be described. In the specification, although the photoelectric sensor 100 for operating as a light receiver among transmissive photoelectric sensors will be described as an example, the photoelectric sensor according to the disclosure may be a photoelectric sensor for operating as a light projector or a reflective photoelectric sensor. The photoelectric sensor 100 includes a housing 30, a protecting portion 10, a window 38, and a cable 39. Also, a light receiving lens 15 is formed in the protecting portion 10.

The housing 30 is made of, for example, metal or resin, and protects various components such as a light receiving element or the like contained in the photoelectric sensor 100 from an external impact and contamination. The housing 30 has a front surface 31, a back surface 32, a side surface 33, a side surface 34, a top surface 35, and a bottom surface 36. A surface on which light from the detection region is incident is defined as the front surface 31, and the back surface 32 is positioned to face the front surface 31 with the interior of the housing 30 located therebetween. Further, the side surface 33 and the side surface 34 are positioned to face each other with the inside of the housing 30 located therebetween. Likewise, the top surface 35 and the bottom surface 36 are also positioned to face each other with the inside of the housing 30 located therebetween.

Mounting holes 37 are provided in the housing 30, and screws or the like can be inserted into the mounting holes 37 to fix the photoelectric sensor 100 to a wall, a floor surface, a ceiling or the like. The distance between the front surface 31 and the back surface 32 is narrower than the distance between the side surface 33 and the side surface 34, so that the thickness of the photoelectric sensor 100 in a side view is configured to be small. For that reason, even when a space for mounting the photoelectric sensor 100 is narrow, the photoelectric sensor 100 can be installed easily. Also, the distance between the front surface 31 and the back surface 32 need not necessarily be narrower than the distance between the side surface 33 and the side surface 34.

A part or the whole of a light receiving unit is accommodated inside the housing 30. The light receiving unit is a unit for detecting light incident from the detection region, and includes the light receiving element and the light receiving lens 15. The light receiving element may be, for example, a photodiode or a position detecting element. The light receiving lens 15 is a lens that focuses light incident from the detection region on the light receiving element. The light receiving lens 15 may be accommodated inside the housing 30, or may be formed in the protecting portion 10 as shown in FIG. 1 and partly exposed to the outside of the housing 30. When the lens is formed in the protecting portion 10 as in this example, there is no need to secure a region for mounting the lens on the substrate. For that reason, it is possible to secure a large mounting space for a component other than the lens, so that a larger component can be mounted on the substrate.

Also, the photoelectric sensor for operating as a light projector has a light projecting unit for emitting light, and the light projecting unit includes a light projecting element, a projecting lens and the like. The light projecting element may be, for example, a light emitting diode (LED) or the like. The light projecting lens may be accommodated inside the housing, and may be integrally formed with the protecting portion and partly exposed to the outside of the housing, similarly to the photoelectric sensor 100 shown in FIG. 1.

The protecting portion 10 protects components such as a light receiving element accommodated in the photoelectric sensor 100. Since the protecting portion 10 is disposed on a surface that receives the light incident from the detection region, it is made of a material that transmits light so that the light receiving element located inside the photoelectric sensor 100 can detect light. For example, the protecting portion 10 may be made of resin or the like. Also, the entire protecting portion 10 is not necessarily made of a material that transmits light, and for example, only the light receiving lens 15 may be made of a member that transmits light, and the light receiving element may detect light through the light receiving lens 15.

The window 38 protects an indicator (not shown) provided on the top of the photoelectric sensor 100 from impact and contamination. The indicator displays a power supply status and a detection status of the photoelectric sensor 100. The indicator may include a light emitting element such as a light emitting diode, for example. The indicator may be lit when the power of the photoelectric sensor 100 is turned ON or when the photoelectric sensor 100 detects a workpiece. Further, the indicator may be lit using light of different colors according to the type of workpiece detected by the photoelectric sensor 100.

The cable 39 transmits electric power supplied from the power source to the photoelectric sensor 100. Further, the cable 39 can connect the photoelectric sensor 100 to an amplifier unit including an amplification section, a control section, and the like, and can transmit the detection results of the photoelectric sensor 100. In the present embodiment, although the cable 39 is connected to the bottom surface 36 of the photoelectric sensor 100, a connection position of the cable 39 is not necessarily the bottom surface 36, and it may be connected to the side surface 33, the side surface 34, the top surface 35, or the like. Also, at least any one of the power source and the amplifier unit may be incorporated in the photoelectric sensor 100.

Figure 2:
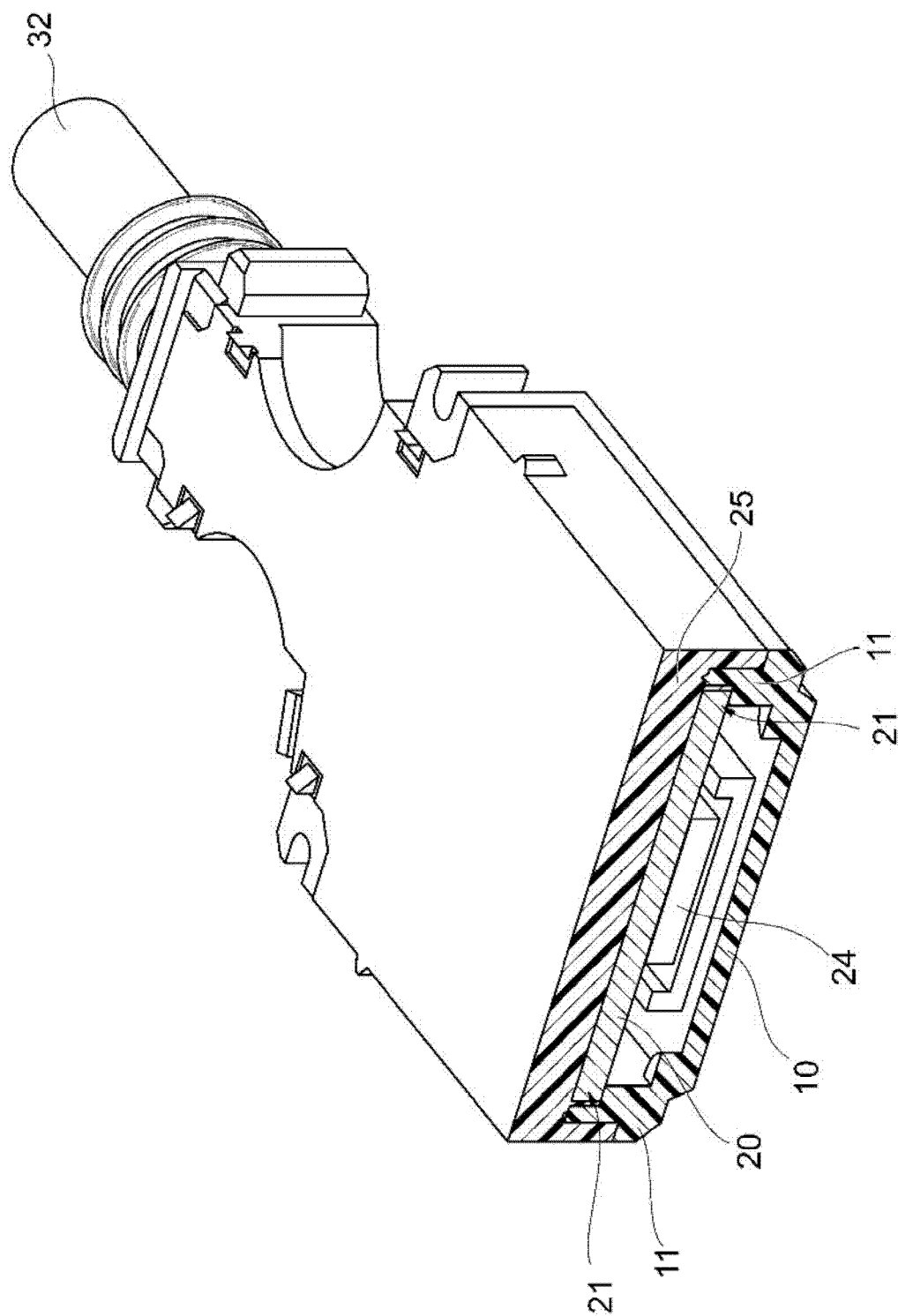
FIG. 2 is a cross-sectional view of the photoelectric sensor according to the embodiment of the disclosure.

FIG. 2 is a cross-sectional view of the photoelectric sensor 100 according to the embodiment of the disclosure and shows a cross-section taken along the line II-II of FIG. 1. With reference to FIG. 2, an internal configuration of the photoelectric sensor 100 according to the present embodiment will be described. This figure shows the interior of the housing 30.

The photoelectric sensor 100 includes a cover (a protecting portion 10 and a side wall 11), a substrate 20, and a sealing member 25. The substrate 20 is positioned to be sandwiched between the protecting portion 10 and the sealing member 25. A light receiving element 24 is mounted on the substrate 20. Also, in the case of a photoelectric sensor operating as a light projector, the light projecting element may be mounted on a substrate. Also, in the case of a reflective photoelectric sensor, both the light projecting element and the light receiving element may be mounted on the substrate.

The cover includes the protecting portion 10 and the side wall 11. The protecting portion 10 is positioned to face the substrate 20. The side wall 11 extends from a peripheral edge of the protecting portion 10 toward the substrate 20 side. The protecting portion 10 and the side wall 11 may be integrally formed as the same member or may be formed as different members.

The side wall 11 prevents the sealing member 25 from flowing into a hollow region provided between the substrate 20 and the protecting portion 10 during the sealing process. An inner side of an end portion of the side wall 11 is recessed to be L-shaped in a cross-sectional view.

A light receiving element 24 such as a photodiode is mounted on the substrate 20. An end portion 21 of the substrate 20 is positioned to abut the L-shaped recess formed in the side wall 11. A hollow region is provided between the substrate 20 and the protecting portion 10, and the light receiving element 24 and the like mounted on the substrate 20 are accommodated in the hollow region. By accommodating the light receiving element 24 in the hollow region, it is possible to reduce a heat shock to the light receiving element 24 and to prevent a failure of the photoelectric sensor 100. Also, arbitrary components such as a light receiving lens or an IC package may be mounted on the substrate 20.

The sealing member 25 seals internal components such as the light receiving element 24 mounted on the substrate 20. Sealing with the sealing member 25 is performed by pouring a heated sealing member 25 into a sealing mold after placing the cover, the substrate 20, etc. in the sealing mold. By sealing with the sealing member 25, it is possible to protect the internal components from moisture, dust and the like. The sealing member 25 may be, for example, a resin such as hot melt.

Figure 3:
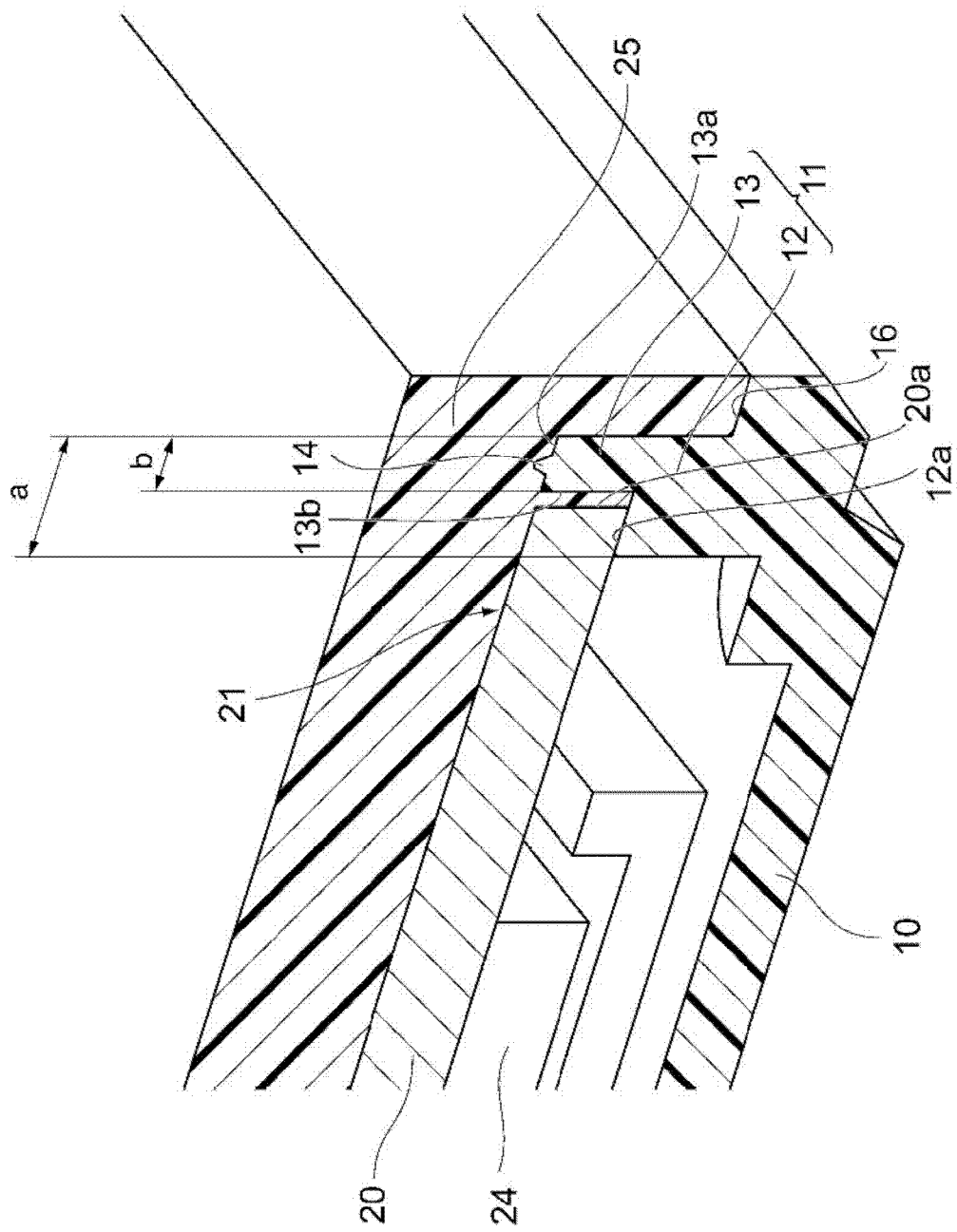
FIG. 3 is an enlarged cross-sectional view of the photoelectric sensor according to the embodiment of the disclosure.

FIG. 3 is an enlarged view of the side wall 11 and the end portion 21 of the substrate 20 in a cross-section of the photoelectric sensor 100 according to the embodiment of the disclosure.

The side wall 11 includes a first portion 12 formed with a first width a, and a second portion 13 formed with a second width b that is smaller than the first width a. The first portion 12 is positioned between the protecting portion 10 and the second portion 13. The second portion 13 extends from an outer region on an end face 12a of the first portion 12 in a direction away from the protecting portion 10 (an upward direction in FIG. 3). The end face 12a of the first portion 12 and an inner wall 13b of the second portion 13 form an L-shaped recess in a cross-sectional view, and the end portion 21 of the substrate 20 is positioned in the L-shaped recess.

The cover has a protruding portion 14. The protruding portion 14 is located outside a side surface 20a of the substrate 20 and is provided on a surface that intersects the extending direction of the side wall 11. In the present embodiment, the protruding portion 14 is provided on an end face 13a of the second portion 13. The end face 13a is orthogonal to the extending direction of the side wall 11. Also, the protruding portion 14 extends in the depth direction of the sheet of FIG. 3 along the longitudinal direction of the side wall 11. The position at which the protruding portion 14 is provided is not limited to the end surface 13a, and may be provided, for example, on an outer peripheral surface 16 located outside the side wall 11.

The sealing with the sealing member 25 will be described. The sealing with the sealing member 25 is performed by arranging the cover, the substrate 20, etc. in the sealing mold as described above, and pouring a high-temperature sealing member 25 into a sealing mold. The injected sealing member 25 is filled into the sealing mold while bringing the substrate 20 and the side wall 11 into contact with each other. When the high-temperature sealing member 25 comes in contact with the protruding portion 14, the protruding portion 14 is softened due to the heat of the sealing member 25. The softened protruding portion 14 fits well with the sealing member 25, so that the adhesion between the cover and the sealing member 25 is increased, thereby improving the sealing performance for the internal components. Further, the cover provided with the protruding portion can be manufactured by die casting rather than by split molding. Therefore, it is unnecessary to prepare a plurality of molds for manufacturing the cover, and the photoelectric sensor can be manufactured at lower cost.

Figure 4:
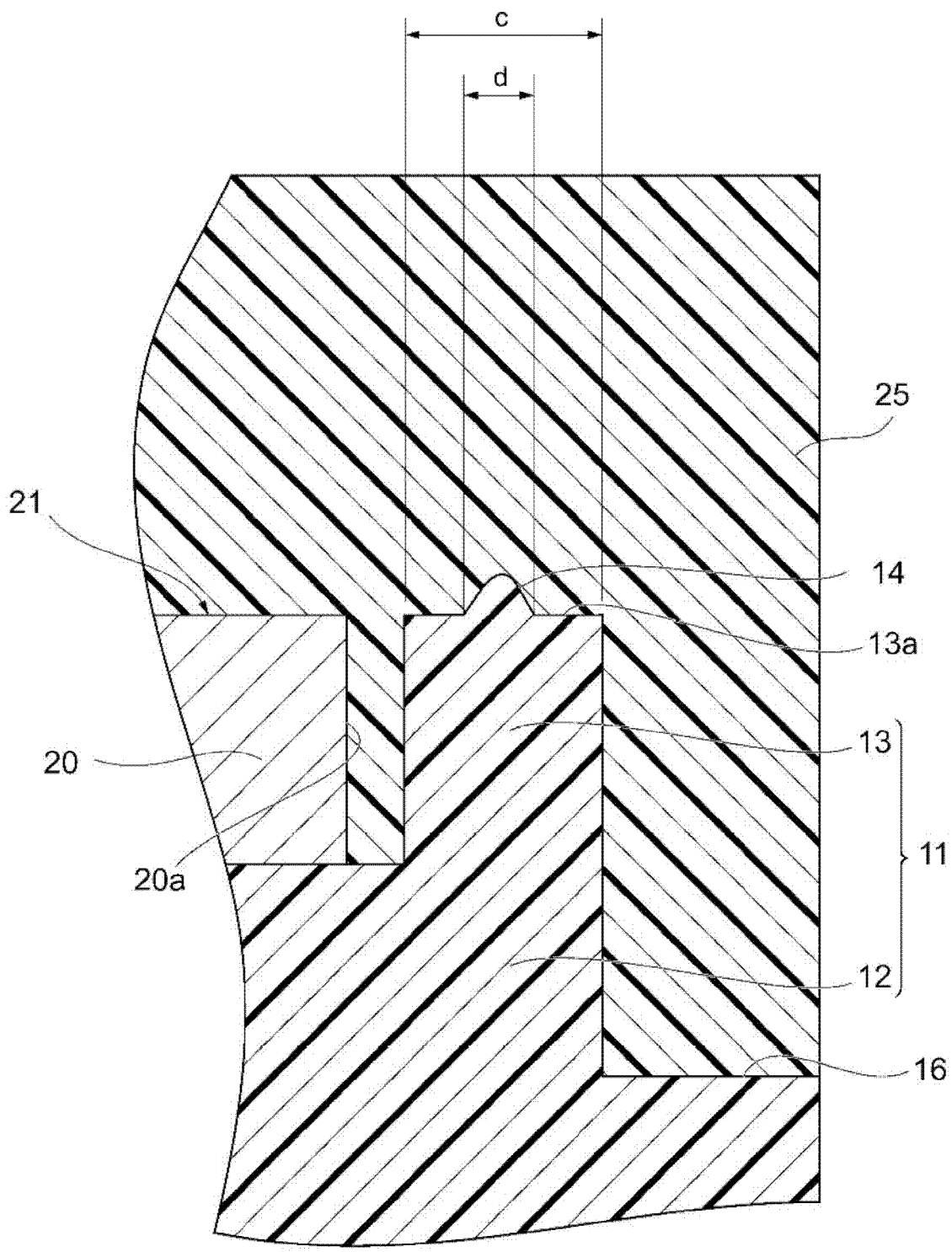
FIG. 4 is an enlarged view of a protruding portion of the photoelectric sensor according to the embodiment of the disclosure.

FIG. 4 is an enlarged view of the protruding portion 14 in a cross-section of the photoelectric sensor 100 according to the embodiment of the disclosure. The protruding portion 14 is provided on the end face 13a of the second portion 13. The end face 13a is formed with a first width c in the lateral direction, and the protruding portion 14 is formed with a second width d that is smaller than the first width c. In the present embodiment, the second width d of the protruding portion 14 is equal to or less than a half of the first width c. As the protruding portion 14 is formed smaller, heat is transferred to the entire protruding portion 14, and the protruding portion 14 can be reliably softened. Further, since the protruding portion 14 is formed to be small, it is possible to provide more protruding portions 14 in the cover, thereby improving the sealing properties.

Figure 5:
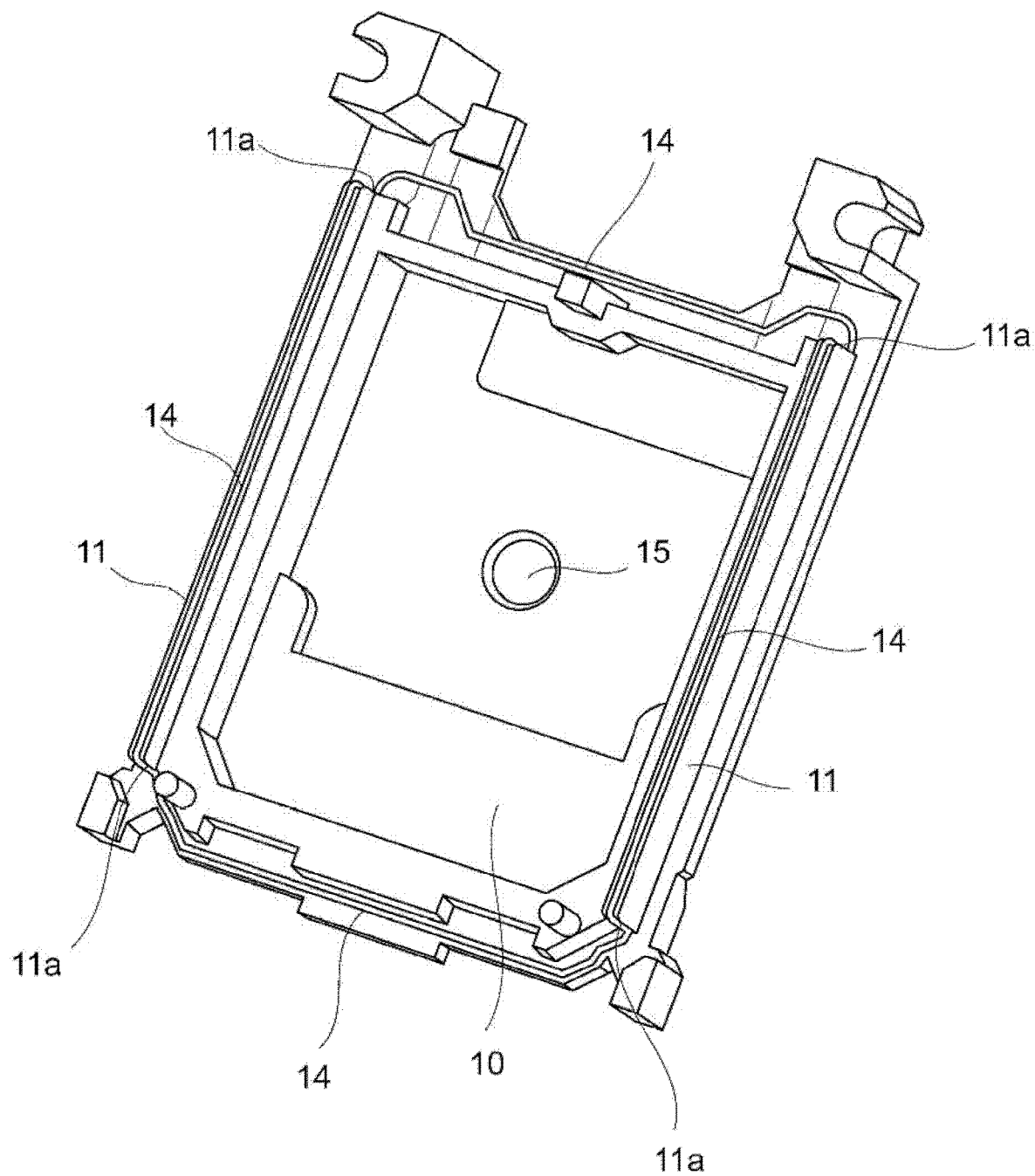
FIG. 5 is a perspective view showing a cover of the photoelectric sensor according to the embodiment of the disclosure.

FIG. 5 is a perspective view showing a cover of the photoelectric sensor 100 according to the embodiment of the disclosure. The cover includes a protecting portion 10 and a side wall 11. The protecting portion 10 has a substantially rectangular shape in a plan view, and two linearly extending side walls 11 are formed to face each other on a peripheral edge of the protecting portion 10. In a state after the photoelectric sensor 100 is assembled, the substrate 20 is positioned to be sandwiched between the two side walls 11.

On an upper portion of the side wall 11, a protruding portion 14 is formed to extend along the longitudinal direction of the side wall 11. The protruding portion 14 is also formed on a periphery of the protecting portion 10 where the side wall 11 is not formed and on the end portion 11a of the side wall 11. That is, in a state in which the substrate 20 is disposed on the cover, the protruding portion 14 extends to surround the substrate 20 in a plan view of the substrate 20.

In this way, by forming the protruding portion 14 over the longitudinal direction of the side wall 11 and over the entire periphery of the cover, it is possible to further increase the adhesion between the cover and the sealing member 25, and it is possible to improve the sealing properties of the internal components.

The protruding portions 14 are not necessarily formed to extend continuously, and may be formed intermittently. For example, substantially conical protruding portions may be provided in parallel in the cover.

The embodiments described above are illustrated for facilitating understanding of the disclosure and are not intended to limit the disclosure. Each element included in the embodiment, its arrangement, material, condition, shape, size, and the like are not limited to those exemplified and can be appropriately changed. In addition, it is possible to partially replace or combine the configurations shown in the different embodiments.

(Supplementary Note)

A photoelectric sensor including at least any one of a light projecting unit for emitting light and a light receiving unit for detecting light, including:

a substrate 20 on which at least any one of the light projecting unit and the light receiving unit is mounted;

a cover which has a protecting portion 10 facing the substrate and for protecting the substrate 20 and a side wall 11 extending from a periphery of the protecting portion; and a sealing member 25 which seals at least any one of the light projecting unit and the light receiving unit that is mounted on the substrate 20, wherein the cover has a protruding portion 14 on a surface which is located outside a side surface 20a of the substrate 20 and intersects an extending direction of the side wall 11, and the protruding portion 14 is in contact with the sealing member 25.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A photoelectric sensor including at least any one of a light projecting unit for emitting light and a light receiving unit for detecting light, comprising:

a substrate on which at least any one of the light projecting unit and the light receiving unit is mounted;

a cover which has a protecting portion facing the substrate and for protecting the substrate and a side wall extending from a periphery of the protecting portion; and a sealing member which seals at least any one of the light projecting unit and the light receiving unit that is mounted on the substrate, wherein the cover has a protruding portion on a surface which is positioned outside a side surface of the substrate and intersects an extending direction of the side wall, and the protruding portion is melted to be in contact with the sealing member.

2. The photoelectric sensor according to claim 1, wherein the protruding portion extends along a longitudinal direction of the side wall.

3. The photoelectric sensor according to claim 2, wherein the protruding portion extends on a peripheral edge of the cover to surround the substrate.

4. The photoelectric sensor according to claim 3, wherein a lens is formed in the protecting portion.

5. The photoelectric sensor according to claim 4, wherein a surface on which the protruding portion is provided is orthogonal to the extending direction of the side wall.

6. The photoelectric sensor according to claim 3, wherein a surface on which the protruding portion is provided is orthogonal to the extending direction of the side wall.

7. The photoelectric sensor according to claim 2, wherein a lens is formed in the protecting portion.

8. The photoelectric sensor according to claim 7, wherein a surface on which the protruding portion is provided is orthogonal to the extending direction of the side wall.

9. The photoelectric sensor according to claim 2, wherein a surface on which the protruding portion is provided is orthogonal to the extending direction of the side wall.

10. The photoelectric sensor according to claim 1, wherein the protruding portion extends on a peripheral edge of the cover to surround the substrate.

11. The photoelectric sensor according to claim 10, wherein a lens is formed in the protecting portion.

12. The photoelectric sensor according to claim 11, wherein a surface on which the protruding portion is provided is orthogonal to the extending direction of the side wall.

13. The photoelectric sensor according to claim 10, wherein a surface on which the protruding portion is provided is orthogonal to the extending direction of the side wall.

14. The photoelectric sensor according to claim 1, wherein a lens is formed in the protecting portion.

15. The photoelectric sensor according to claim 14, wherein a surface on which the protruding portion is provided is orthogonal to the extending direction of the side wall.

16. The photoelectric sensor according to claim 1, wherein a surface on which the protruding portion is provided is orthogonal to the extending direction of the side wall.

* * * * *